(12) United States Patent
Sakamoto et al.

(10) Patent No.: US 7,562,994 B2
(45) Date of Patent: Jul. 21, 2009

(54) LIGHTING APPARATUS AND A DISPLAY APPARATUS THEREWITH

(75) Inventors: Yoshiaki Sakamoto, Kawasaki (JP);
Toshiro Takahashi, Kawasaki (JP);
Masaya Nakayama, Kawasaki (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 244 days.

(21) Appl. No.: 11/156,572

(22) Filed: Jun. 21, 2005

(65) Prior Publication Data
US 2006/0209225 A1 Sep. 21, 2006

(30) Foreign Application Priority Data
Mar. 15, 2005 (JP) ............... 2005-073981

(51) Int. Cl.
*F21V 9/16* (2006.01)
(52) U.S. Cl. ............... 362/84; 349/69; 313/498; 313/504; 313/506; 313/503; 313/502
(58) Field of Classification Search ............... None
See application file for complete search history.

(56) References Cited

U.S. PATENT DOCUMENTS

| | | | | |
|---|---|---|---|---|
| 3,317,722 A | * | 5/1967 | Whitney ............... | 313/512 |
| 5,969,850 A | * | 10/1999 | Harrold et al. ............... | 359/320 |
| 6,411,019 B1 | * | 6/2002 | Hofstra et al. ............... | 313/112 |
| 6,603,528 B1 | * | 8/2003 | Tanaka et al. ............... | 349/155 |
| 6,819,380 B2 | * | 11/2004 | Wen et al. ............... | 349/114 |
| 6,986,598 B2 | * | 1/2006 | Chu et al. ............... | 362/561 |
| 2002/0175620 A1 | | 11/2002 | Yokoyama et al. ............... | 313/505 |
| 2002/0196393 A1 | * | 12/2002 | Tashiro et al. ............... | 349/106 |
| 2004/0100423 A1 | * | 5/2004 | Nagakubo et al. ............... | 345/40 |
| 2004/0233360 A1 | * | 11/2004 | Yoshida et al. ............... | 349/114 |
| 2005/0052383 A1 | * | 3/2005 | Suzuki ............... | 345/87 |

FOREIGN PATENT DOCUMENTS

JP    2001-35652    2/2001

* cited by examiner

*Primary Examiner*—Sandra L O'Shea
*Assistant Examiner*—Danielle Allen
(74) *Attorney, Agent, or Firm*—Kratz, Quintos & Hanson, LLP

(57) ABSTRACT

A lighting apparatus and a display apparatus therewith are disclosed. The lighting apparatus includes a first light-transmitting electrode layer, a second light-transmitting electrode layer, and a luminous layer that is sandwiched by the first and the second light-transmitting electrode layers. At least one of the first and the second light-transmitting electrode layers includes at least a first conductive member and a second conductive member. Layout patterns of the first and the second conductive members are different from each other.

15 Claims, 16 Drawing Sheets

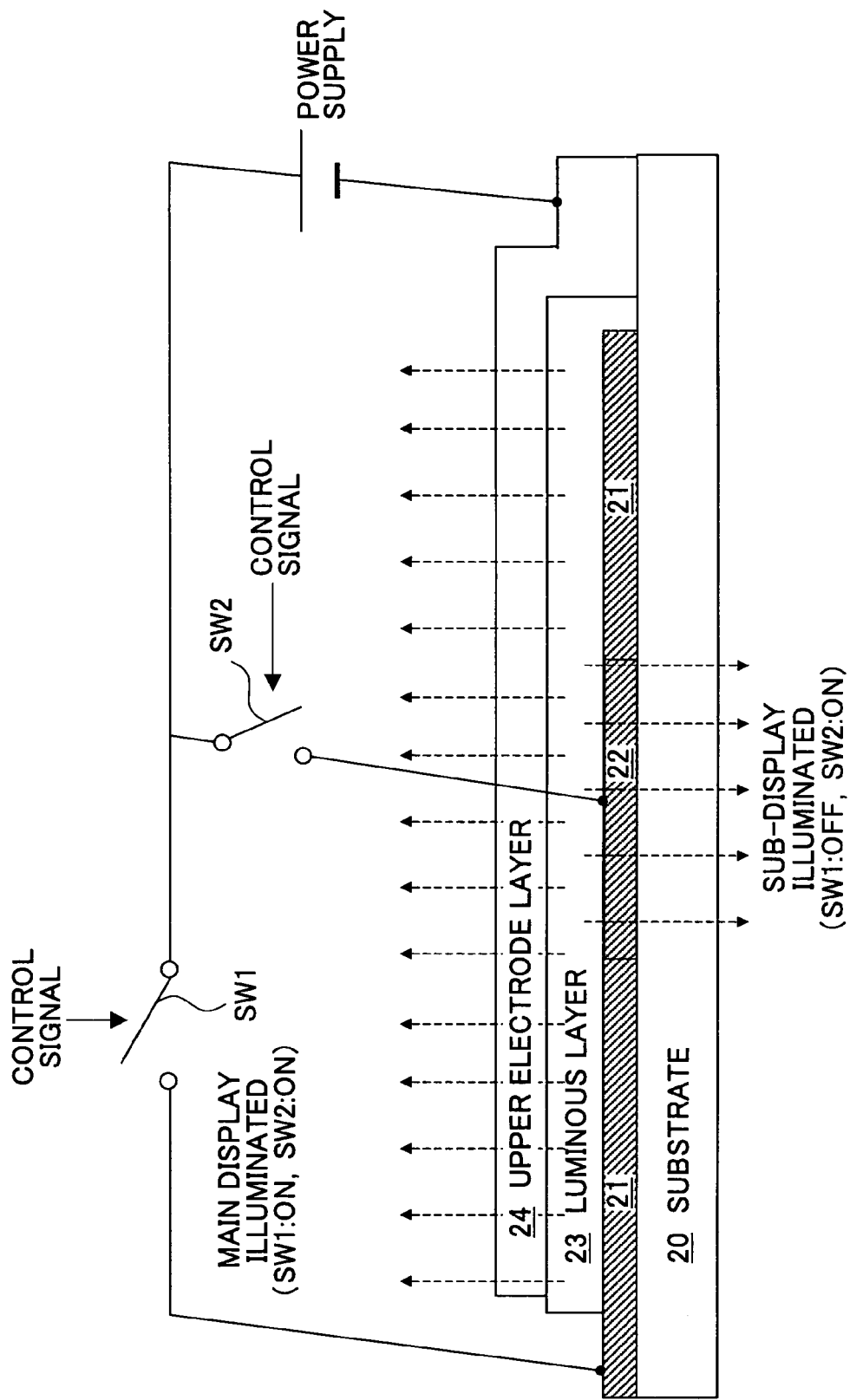

FULL OPERATING MODE

PARTIAL OPERATING MODE

FULL OPERATING MODE

PARTIAL OPERATING MODE

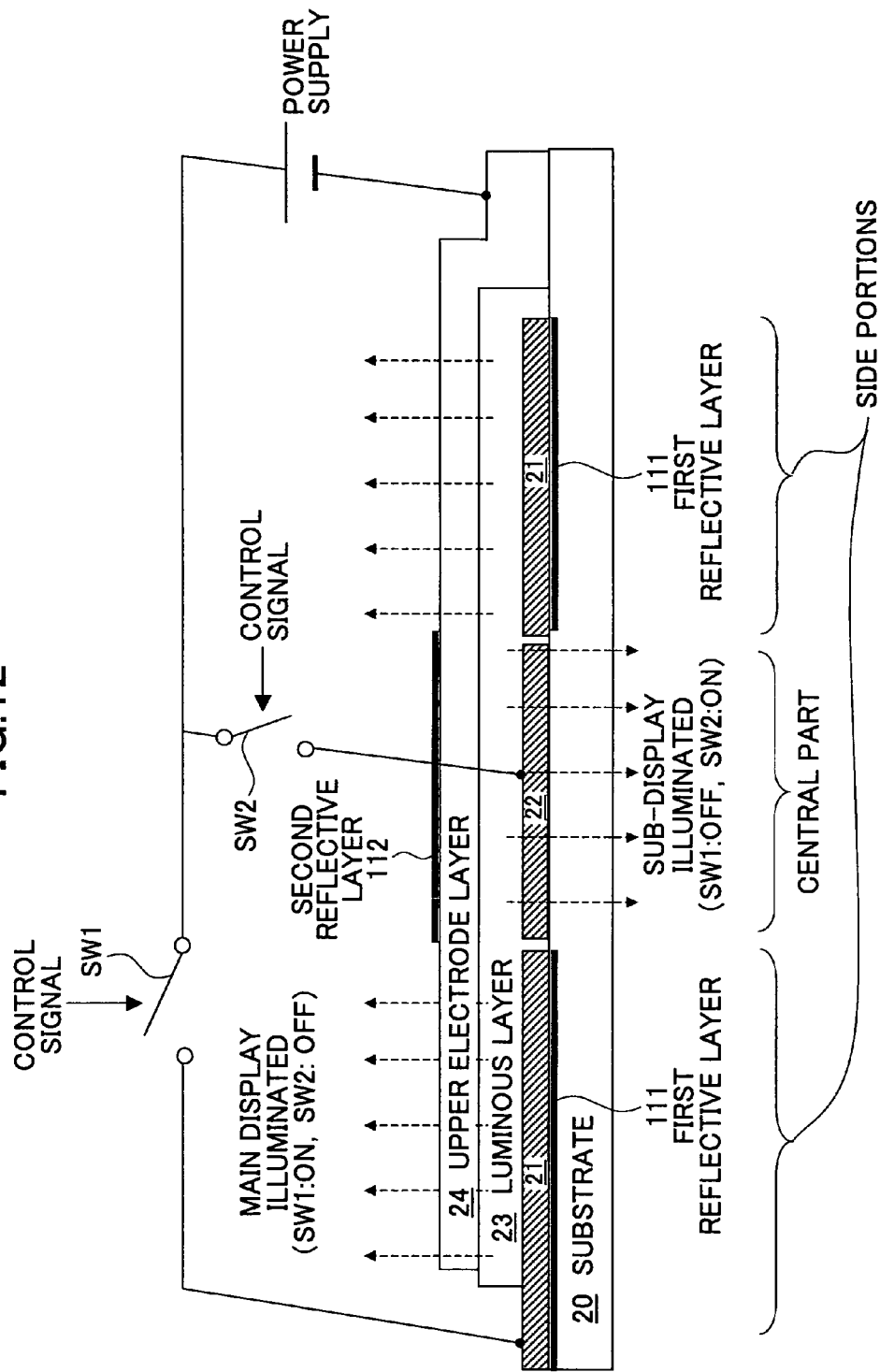

FIG.16

Conventional methods [UNIT: mm]

| CONVENTIONAL METHODS | | COMMON BACK LIGHT | EXCLUSIVE BACK LIGHT |
|---|---|---|---|
| | LED | 1.3 | 2.6 |
| | CCFL | 2 | 4 |
| | INORGANIC EL | <1 | |

[UNIT: mm]

| EMBODIMENT 1 | <1 (DEPENDS ON SUBSTRATE THICKNESS) |
|---|---|
| EMBODIMENT 2 | |
| EMBODIMENT 3 | |

FIG.17

| CONVENTIONAL METHODS: | | LED | CCFL | INORGANIC EL |
|---|---|---|---|---|
| CONSUMPTION POWER RATIO | MAIN DISPLAY (2") | 70% | 95% | 45% |
| | SUB-DISPLAY (1") | 17% | 24% | 11% |
| THICKNESS RATIO | | ≦ 77% | ≦ 50% | SAME |

LIGHTING APPARATUS AND A DISPLAY APPARATUS THEREWITH

BACKGROUND OF THE INVENTION

1. Field of the Invention

The present invention generally relates to a lighting apparatus, and especially relates to a lighting apparatus that has a luminous layer inserted between two electrode layers.

2. Description of the Related Art

Devices that are equipped with displays on both sides of an opening-and-closing (folding-and-unfolding) section, such as a folding type cellular phone, are widely used. With such devices, users can view some information regardless of the opening-and-closing state of the section. Such devices often use a liquid crystal display (LCD) for displaying. Since the LCD does not emit light by themselves, a back light or front light, which is an internal light source, is required in order to make visible the information to be displayed. As the internal light source, a layer of electroluminescent (EL) material can be used. When preparing the displays on both sides of the opening-and-closing section, one straightforward configuration is separate LCD and separate internal light sources for each of the sides. According to this configuration, two sets of displays, each consisting of an LCD and an internal light source, are provided, one on the front side and the other on the rear side.

However, this configuration is disadvantageous in view of increased thickness of the display. This is because it is necessary to provide a certain distance between the two sides in order to prevent the display on one side from interfering with the display on the other side. Especially in the case of portable devices that are required to be small and thin, increase in the thickness is especially a disadvantage. An example of solving this problem is shown in FIG. 1, wherein the two sides share one internal light source. According to the example shown in FIG. 1, a luminous layer is sandwiched by a surface electrode layer and a back electrode layer, each being covered by an insulation layer. Here, the single luminous layer serves two displays, and thickness, weight, etc., are reduced accordingly.

[Patent Reference 1] JPA 2001-35652

Problem(s) to be Solved by the Invention

Here, it is often the case that dimensions of the two displays are different. That is, one side (main display) has a greater area than the other side (sub-display). If the single luminous layer is shared by the front and rear displays, the luminous layer provides the same light volume to both displays, regardless of the size difference. Accordingly, when information is displayed only on the sub-display, the luminous layer provides a light volume beyond necessity, which is a problem in that it uselessly consumes energy. Since it is important for the portable devices to save power, the problem is highly disadvantageous. The problem is not only with a display using an EL layer but also with other displays that use a back light (the light source being light emitting diodes (LED), a cold-cathode fluorescent lamp (CCFL), etc.), wherein the light is uniformly distributed from the light source by an optical guide plate for the greater display area. That is, when only a smaller area is used for display, the use efficiency of the light is degraded.

SUMMARY OF THE INVENTION

Accordingly, it is a general object of the present invention to provide a lighting apparatus that substantially obviates one or more of the problems caused by the limitations and disadvantages of the related art.

A specific object of the present invention includes providing a lighting apparatus that is thin and operates at a reduced power level, the lighting apparatus having a luminous layer that is sandwiched by two light-transmitting electrode layers.

Features and advantages of the present invention are set forth in the description that follows, and in part will become apparent from the description and the accompanying drawings, or may be learned by practice of the invention according to the teachings provided in the description. Objects as well as other features and advantages of the present invention will be realized and attained by a lighting apparatus particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a lighting apparatus that includes a first light-transmitting electrode layer, a second light-transmitting electrode layer, and a luminous layer prepared between the first and the second light-transmitting electrode layers. There, at least one of the first and the second light-transmitting electrode layers has at least two conductive members (first and second conductive members), having layout patterns different from each other.

Effect of the Invention

According to the present invention, the thickness and power consumption of the lighting apparatus having the luminous layer inserted between the two light-transmitting electrode layers can be reduced as compared with conventional practices.

BRIEF DESCRIPTION OF THE DRAWINGS

FIG. 4 is a cross-sectional diagram of the display;

FIG. 12 is a cross-sectional diagram of the display according to the Embodiment 3 of the present invention;

FIG. 16 gives tables for comparing thickness between the displays according to Embodiments of the present invention and the conventional examples; and FIG. 17 is a table for comparing the displays according to Embodiment 3 of the present invention with the conventional example.

DESCRIPTION OF THE PREFERRED EMBODIMENTS

Figure 1:
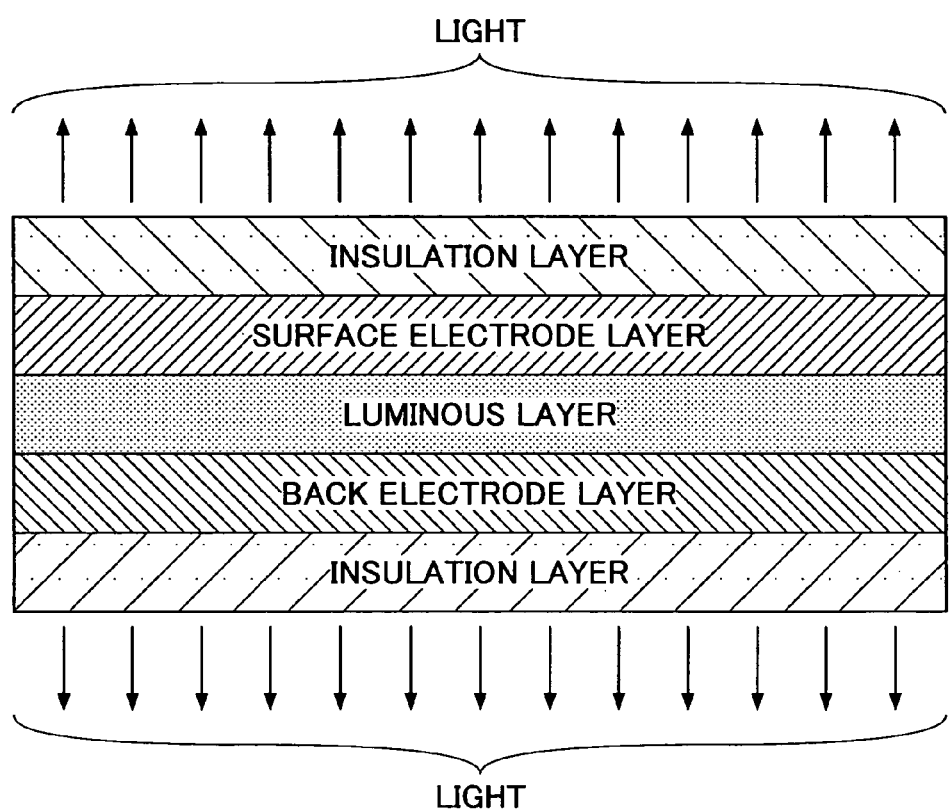
FIG. 1 is a cross-sectional diagram showing a part of a conventional display.

In the following, Embodiments of the present invention are described with reference to the accompanying drawings.

According to an aspect of the present invention, the lighting apparatus includes a luminous layer that is prepared between the first and the second light-transmitting electrode layers, wherein at least one of the first and the second light-transmitting electrode layers has the first and the second conductive members, the layout patterns of the conductive members differing from each other. Light is selectively emitted from all or a part of a range wherein the luminous layer is formed by giving a predetermined potential to one or both of the first and the second conductive members. In this manner, unnecessary light emission is avoided.

According to an aspect of the present invention, a switching unit is provided for applying and removing the potential to the first and the second conductive members such that a light emission area of the luminous layer is controlled. By using the switching unit, the light emission area of the lighting apparatus can be suitably adjusted.

According to an aspect of the present invention, a liquid crystal board is provided for receiving the light from the luminous layer. According to an aspect of the present invention, the lighting apparatus can be of a double-sided luminescence type. The ability to change the light emission area of the luminous layer according to the size of displaying area is convenient especially for a device equipped with a double-sided luminescence type lighting apparatus. According to an aspect of the present invention, one display is illuminated by applying a predetermined voltage to the first conductive member, and the other display is illuminated by applying a predetermined voltage to the second conductive member.

According to an aspect of the present invention, although a predetermined voltage is selectively applied to one of the first and the second conductive members, a predetermined voltage may be continuously applied to the other side. This is desirable from a viewpoint of simplifying the layout pattern. According to an aspect of the present invention, a predetermined voltage may be applied to one of the first and second conductive members. This is advantageous from a viewpoint of uniformly using the luminous layer.

According to an aspect of the present invention, the luminous layer consists of the same luminous layer over a formation area of the first and the second conductive members. In this manner, the light emission area can be divided by a manufacturing process having the same number of steps as a conventional process. According to an aspect of the present invention, the luminous layer is an electroluminescent layer, especially an organic electroluminescent layer. In this manner, a lighting apparatus that is especially advantageous in view of color displaying and white luminescence at a low voltage is obtained.

According to an aspect of the present invention, the layout patterns of the first and the second conductive members are formed like comb-teeth. The layout patterns of the first and the second conductive members have two or more stripe-like linear elements, and the linear elements of the first and the second conductive members may be alternately located in a certain area. This is desirable from a viewpoint that the luminous area is uniformly used without the conductive members being overlapped.

According to an aspect of the present invention, a light reflective layer that counters at least one of the conductive members is provided. There, the layout pattern of the light reflective layer may be the same as the layout pattern of at least one of the conductive members. The light reflective layer may consist of metal. The light from the luminous layer is efficiently directed to the display by the reflective layer. For this reason, this aspect is advantageous especially from a viewpoint of reducing power consumption. Further, one of the conductive members can be made to also serve as the light reflective layer, being constituted by an electrically conductive material that has an optical reflection property.

Embodiment 1

Figure 2:
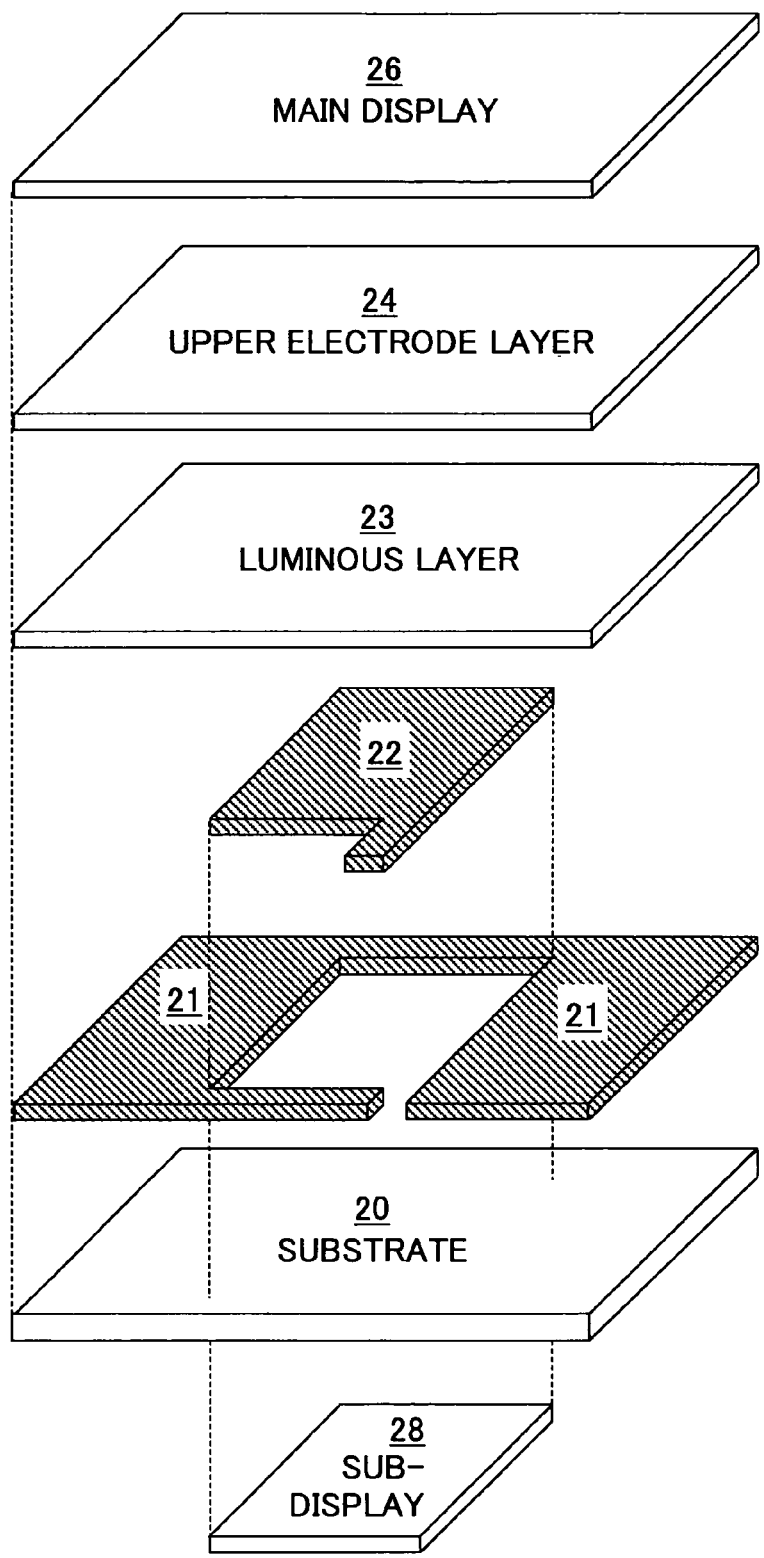
FIG. 2 is an exploded perspective view of a display according to Embodiment 1 of the present invention.

FIG. 2 is an exploded perspective view of the display according to Embodiment 1 of the present invention. The display includes a substrate 20, lower electrode layers 21 and 22, a luminous layer 23, an upper electrode layer 24, a main display 26, and a sub-display 28. In the descriptions that follow, the words "higher" and "lower" are often used; nevertheless, the words are for explanation convenience, and the present invention can be applied to other relative positions.

The substrate 20 is made of one of transparent glass and plastic.

Figure 3:
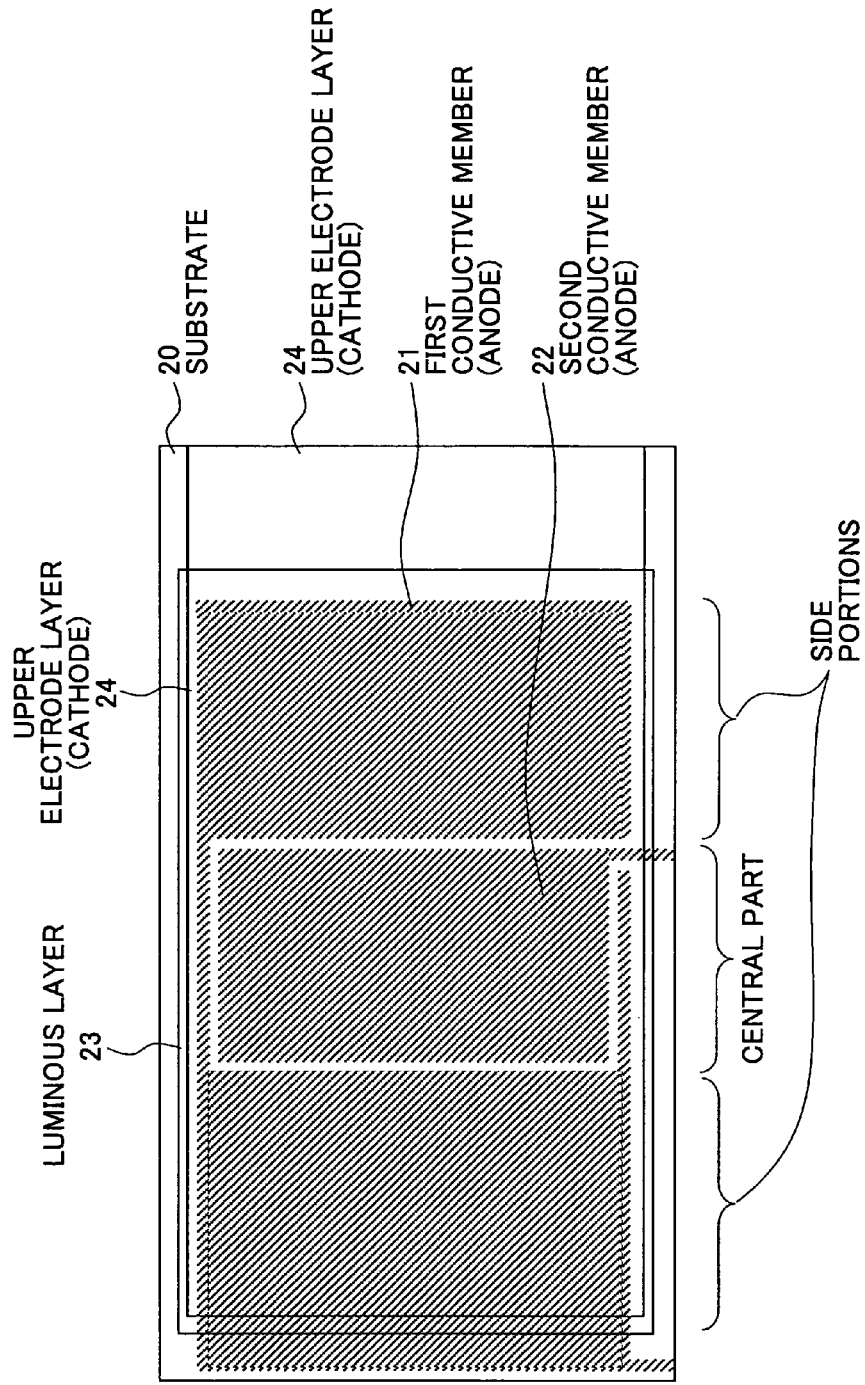
FIG. 3 is a plan view of the display.

The lower electrode layers 21 and 22 are light-transmitting electrodes that function as anodes, and serve as the first conductive member 21 and the second conductive member 22, respectively, which have respective predetermined layout patterns. According to Embodiment 1, the all area of the rectangle-like luminous layer 23 is covered by the first and the second conductive members 21 and 22 as shown in FIG. 3. Furthermore, the rectangular area is divided into three portions, namely, side portions consisting of right and left portions, and a central part. There, the first conductive member 21 covers the side portions (i.e., right and left portions), and the second conductive member 22 covers the central part. The lower electrode layers 21 and 22 as described above can be obtained by forming an Indium Tin Oxide (ITO) film on the surface of the substrate 20, and by performing photolithography and etching. The first and the second conductive members 21 and 22 include a terminal section for connecting a driving circuit that is not illustrated in FIG. 2.

The luminous layer 23 is made of an electroluminescent material, hence called an EL layer. The material and layer configuration of the EL layer can be suitably chosen according to applications. Where an application requires white luminescence and a color display, the luminous layer is desirably made of an organic EL material. When using an organic EL material, the luminous layer 23 can be formed by any suitable film forming method such as vacuum deposition for a low molecular weight material, and a printing method for a polymeric material. A metal mask, etc., may be used for patterning of the luminous layer 23.

The upper electrode layer 24 is a light-transmitting electrode that functions as a cathode. The upper electrode layer 24 is formed such that it covers the all area of the luminous layer 23. The upper electrode layer 24 is made of a light-transmitting material such as an ITO film, like the lower electrode layers 21 and 22; however, it is desirable to form the ITO film by a low-temperature film forming method such as ion plating so that the luminous layer 23 serving as the ground may not be degraded at the time of the film formation. Patterning can be performed by using a metal mask, etc., at the time of the film formation. The upper electrode layer 24 also includes a terminal section for connecting a driving circuit that is not illustrated in FIG. 2. A transparent protection substrate (a protection layer), illustration of which is omitted, is provided on the upper surface of the upper electrode layer 24 so that the luminous layer 23 is completely covered and protected from the atmosphere.

The main display 26 is formed on the upper electrode layer 24 side with reference to the luminous layer 23, and the sub-display 28 is formed on the lower electrode layer 22 side with reference to the luminous layer 23. The main display 26 and the sub-display 28 do not emit light by themselves, and consist of LCDs according to the present embodiment. The main display 26 has a greater display area corresponding to the size of the upper electrode layer 24 than the sub-display 28 that has a smaller display area corresponding to the size of the second conductive member 22. The main display 26 and the sub-display 28 are formed on the front and reverse sides, respectively, of an opening-and-closing section of an apparatus such as a folded type portable telephone, the main display 26 and the sub-display 28 displaying certain information indicating whether the opening-and-closing section is open or closed.

FIG. 4 is a cross-sectional diagram of the display, wherein the main display 26 and the sub-display 28 are omitted for simplicity of the illustration. The display includes a driving circuit that consists of a DC power supply, a first switch SW1, and a second switch SW2. The first switch SW1 electrically connects and disconnects the first conductive member 21 of the lower electrode layer and the upper electrode layer 24 according to a control signal. The second switch SW2 electrically connects and disconnects the second conductive member 22 of the lower electrode layer and the upper electrode layer 24 according to a control signal. When a suitable voltage is applied to the luminous layer 23 by the upper and/or the lower electrode layers, light is emitted from the luminous layer, and an LCD (not illustrated) is illuminated.

Figure 5A:
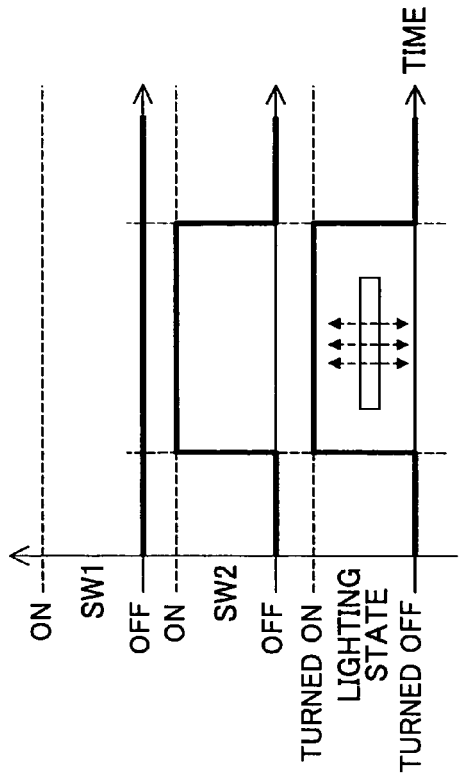
FIGS. 5A and FIG. 5B are graphs explaining a light-emitting operation of the display.
Figure 5B:
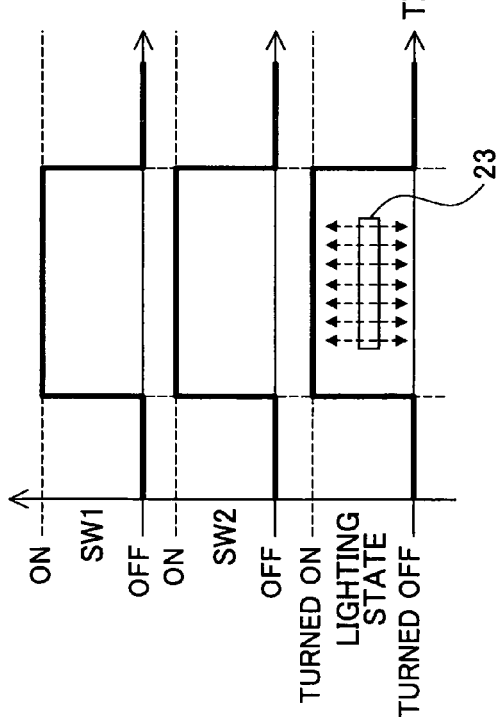
Figure 6:
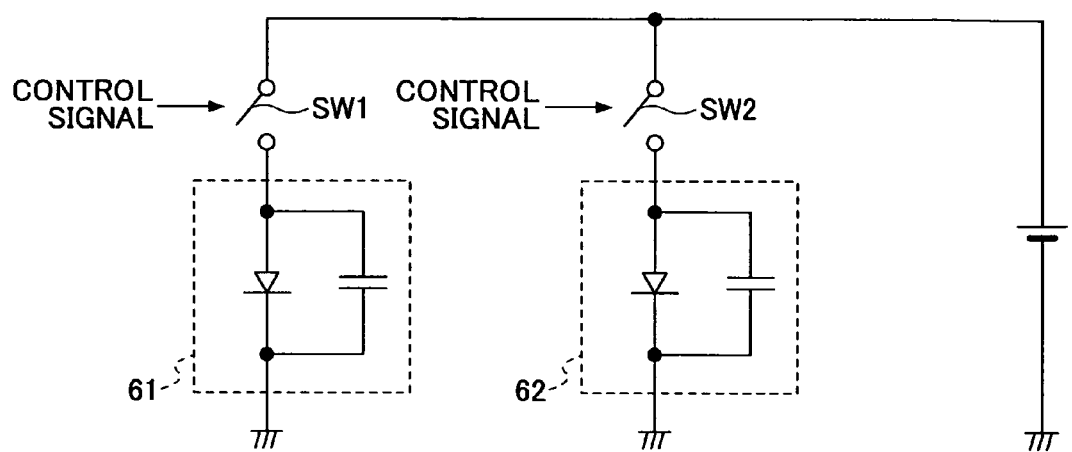
FIG. 6 is a circuit diagram showing an equivalent circuit of the display.

FIG. 5A and FIG. 5B are graphs for explaining light-emitting operations of the display shown in FIGS. 2, 3 and 4. FIG. 6 shows an equivalent circuit of the display. With reference to the equivalent circuit, the first conductive member 21 of the lower electrode layer, the luminous layer 23, and the upper electrode layer 24 are represented by a circuit block 61 that consists of a diode and a capacitor connected in parallel. Further, the second conductive member 22 of the lower electrode layer, the luminous layer 23, and the upper electrode layer 24 are represented by a circuit block 62 that consists of a diode and a capacitor connected in parallel. Under a full operating mode (full luminescence), a control signal is generated such that the first switch SW1 and the second switch SW2 are closed as shown in FIG. 5A, and a predetermined voltage is applied to both circuit blocks 61 and 62. Consequently, light is emitted from the all area of the luminous layer 23. With reference to the third (bottom) graph in FIG. 5A, "lighting state" shows a state of lighting. Arrows from the luminous layer 23 express that the light is emitted from the all area of the luminous layer 23 that counters the first and the second conductive members 21 and 22. The light is received by the main display 26 (FIG. 2), and used for information display by the main display 26.

On the other hand, if the control signal is generated such that the first switch SW1 is open and the second switch SW2 is closed, a partial operating mode is provided. Under this situation, the predetermined voltage is applied only to a part corresponding to the circuit block 62, and no voltage is applied to the circuit block 61 as shown in FIG. 5B. Accordingly, only the area that counters the second conductive member 22 out of the luminous layer 23 emits light, and the area that counters the first conductive member 21 does not emit light. Accordingly, fewer arrows (than in the case of the full operating mode) come out of the luminous layer 23 as shown at "lighting state" of FIG. 5B. The emitted light is received by the sub-display 28, and used for information display by the sub-display 28.

According to Embodiment 1, only the area that counters the second conductive member 22 out of the luminous layer 23 emits light to the sub-display 28. When illuminating only the sub-display 28, the all area of the luminous layer 23 does not need to be turned on, and only the area required for the sub-display 28 should be turned on. In this manner, power consumption efficiency is raised.

Embodiment 2

The display according to Embodiment 1 can lower power consumption by selectively using all or a part of the luminous layer 23 according to need for the main display 26 and the sub-display 28. However, since the layout pattern as shown in FIG. 2 and FIG. 3 is used, the central part of the luminous layer 23 (the central part countering the second conductive member 22 corresponding to the sub-display 28) is always emitting light. This is also evident from the opening and closing states of the second switch SW2 of FIG. 5. That is, when the display is used, the second switch SW2 is always closed. Accordingly, as for the luminous layer 23, the part corresponding to the central part is turned on longer than the side portions (i.e., the portion corresponding to the first conductive member 21). For this reason, the central portion tends to be degraded faster than the side portions of the luminous layer 23. When the level of degradation of the luminous layer 23 is different from place to place on the luminous layer 23, there is a possibility that the central part will display darker than other areas in the full operating mode. Embodiment 2 copes with this problem.

Figure 7:
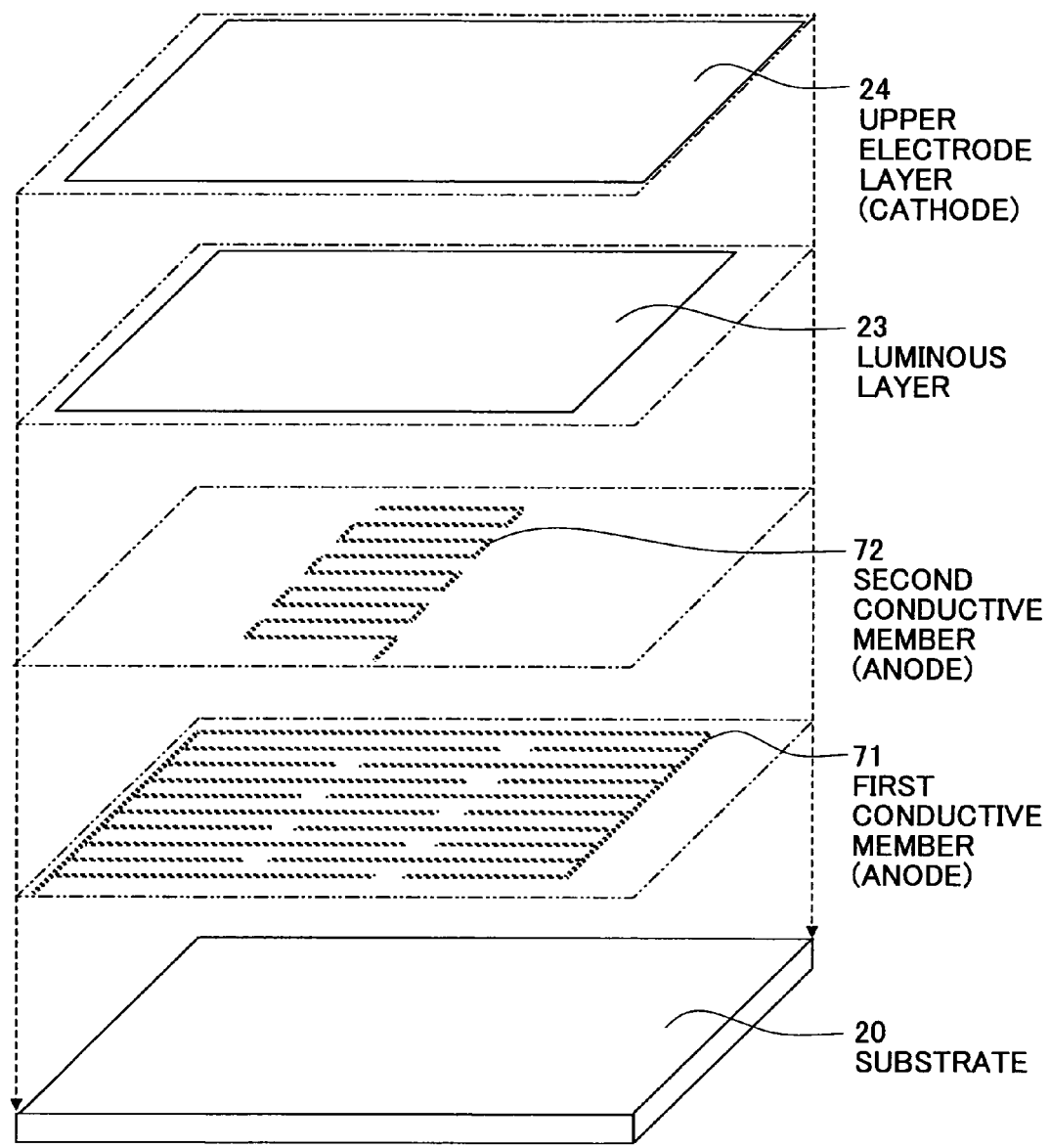
FIG. 7 is an exploded perspective view of the display according to Embodiment 2 of the present invention.
Figure 8:
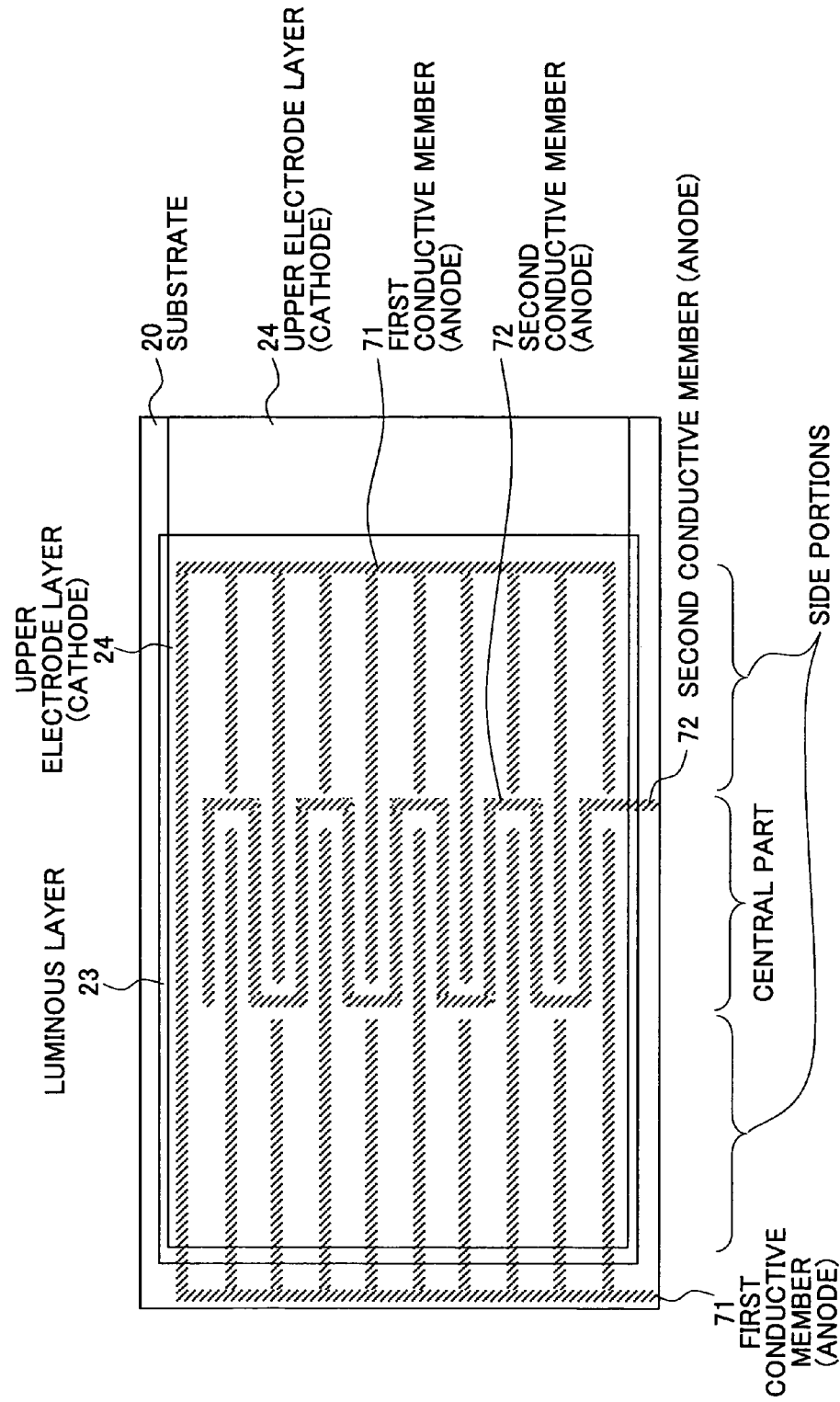
FIG. 8 is a plan view of the display.

FIG. 7 is an exploded perspective view of the display according to Embodiment 2. The same reference numbers are given to the same elements in FIG. 3, and description thereof is not repeated. The major difference of Embodiment 2 from Embodiment 1 is in lower electrode layers 71 and 72. The lower electrode layers consist of a first conductive member 71 and a second conductive member 72. FIG. 8 shows the plan view of the display. As shown, the first conductive member 71 covers the all area of the luminous layer 23 with two or more linear elements extended horizontally in the drawing. The layout pattern of the linear elements may be in any form such as the shape of stripes, comb-teeth, and unicursal (drawn without lifting a brush from paper) under certain conditions as described below. The second conductive member 72 is provided in the area corresponding to the central part of the luminous layer 23. The layout pattern of the second conductive member 72 is made in a zigzag form (or a nesting form) such that the layout patterns of the first conductive member 71 and the second conductive member 72 are not overlapped. The linear elements of the first conductive member 71 extend from right to left with a break (gap) so that the linear elements do not overlap the second conductive member 72. In the central part, the first conductive member 71 and the second conductive member 72 are alternately arranged. Although the line breadth and the interval (pitch) of the conductive members 71 and 72 can be suitably set up according to use, it is desirable that the layout patterns be dense such that the display is uniformly illuminated.

Figure 9A:
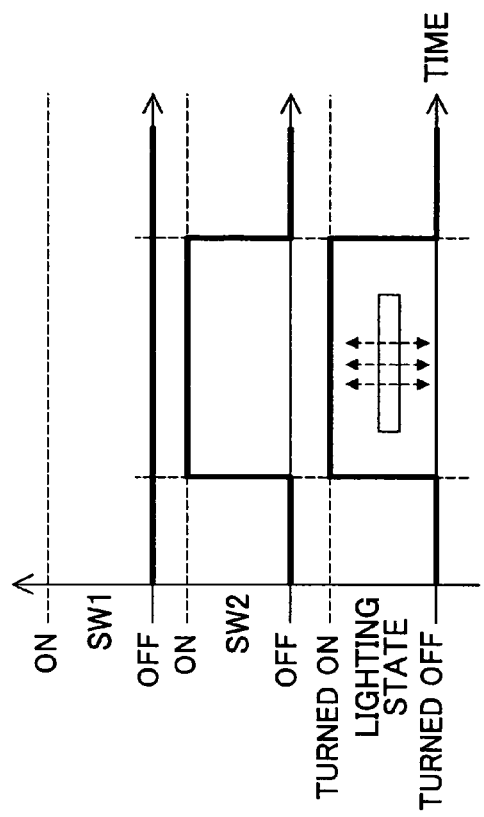
FIGS. 9A and FIG. 9B are graphs explaining a light-emitting operation of the display.
Figure 9B:
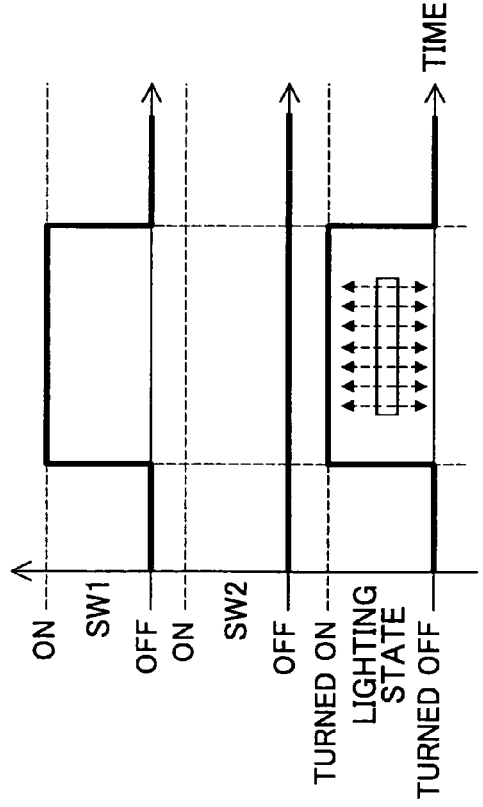

FIG. 9A and FIG. 9B give graphs for explaining the light-emitting operation of the display. The equivalent circuit given in FIG. 6 also applies to this Embodiment. As shown in FIG. 9A, the full operating mode is obtained by closing only the first switch SW1 (the predetermined voltage is applied to the circuit block 61). The predetermined voltage is not applied to the circuit block 62, and the circuit block 62 is not driven. Consequently, light is emitted from the area of the luminous layer 23, the area countering the first conductive member 71. Since the first conductive member 71 has a stripe-like layout pattern, the area wherein luminescence takes place also becomes stripe-like in form. However, if the linear elements are densely provided at a fine pitch, brightness differences causing brightness spots (brightness spots formed along with the electrode pattern) due to the interval of the linear elements can be made invisible. The "lighting state" at the bottom of FIG. 9A shows the lighting state, wherein arrows coming out of the luminous layer 23 express that light is emitted from the all area of the luminous layer 23. The light is received by the main display 26 (FIG. 2), and used for information display by the main display 26.

On the other hand, the partial operating mode is obtained by opening the first switch SW1 and closing the second switch SW2; thereby the predetermined voltage is applied only to the circuit block 62, and the predetermined voltage is not applied to the circuit block 61. In this way, only a part of the luminous layer 23 emits light as shown in FIG. 9B. Under the partial operating mode, only the area corresponding to the second conductive member 72 emits light out of the luminous layer 23, and the area corresponding to the first conductive member 71 does not emit light. The partial operating mode as described above is expressed by fewer arrows (than the full operating mode) coming out of the luminous layer 23 as shown at the bottom of FIG. 9B. The light is received by the sub-display 28, and used for information display by the sub-display 28. Since the second conductive member 72 has the winding layout pattern, the luminescence takes place according to the winding layout. However, if the interval of the linear element is made fine, the brightness spots (brightness spots formed along with the electrode pattern) due to the interval of the linear elements can be made invisible.

According to Embodiment 2, only the area that counters the second conductive member 72 out of the luminous layers 23 emits the light to the sub-displays 28. When the light is required only by the sub-display 28, the all area of the luminous layer 23 does not have to be turned on, and only the area required by the sub-display 28 should be turned on. In this manner, the efficiency of power use is enhanced. As shown in FIGS. 7 and 8, since the layout of the second conductive member 72 is not overlapped with the first conductive member 71, different portions of the luminous layer 23 are turned on according to the operating mode, namely, full operating mode and partial operating mode. In this manner, the luminous layer 23 is more uniformly driven as compared with Embodiment 1, extending the service life of the luminous layer 23. Although Embodiment 2 may spoil an aperture ratio to some extent, since the areas of the luminous layer used for the main display and the sub-display differ, the burden (degradation) of the luminous layer is uniformly distributed.

Figure 10:
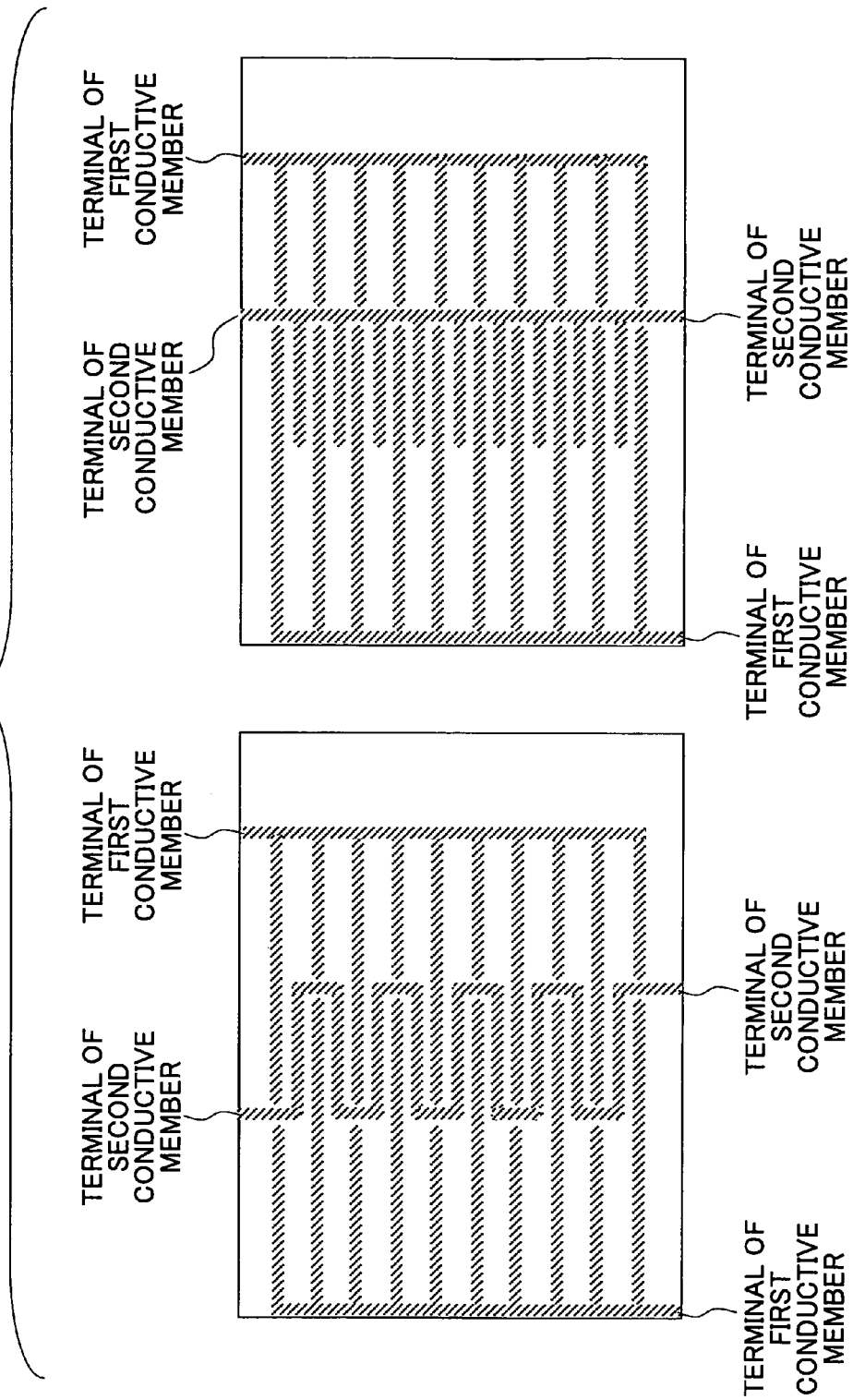
FIG. 10 gives plan views showing a modification of a layout pattern of an electrode layer.

Here, a concern may be that when a voltage drop over the path of the stripe-like and zigzag-shaped conductive members becomes great, the voltage drop causes a bad influence on lighting control. In such a case, two or more terminals are desirably provided as shown in FIG. 10 to the conductive members 71 and 72. In this manner, the voltage drop by resistance of the electrode is minimized, and brightness unevenness can be reduced.

Embodiment 3

Figure 11:
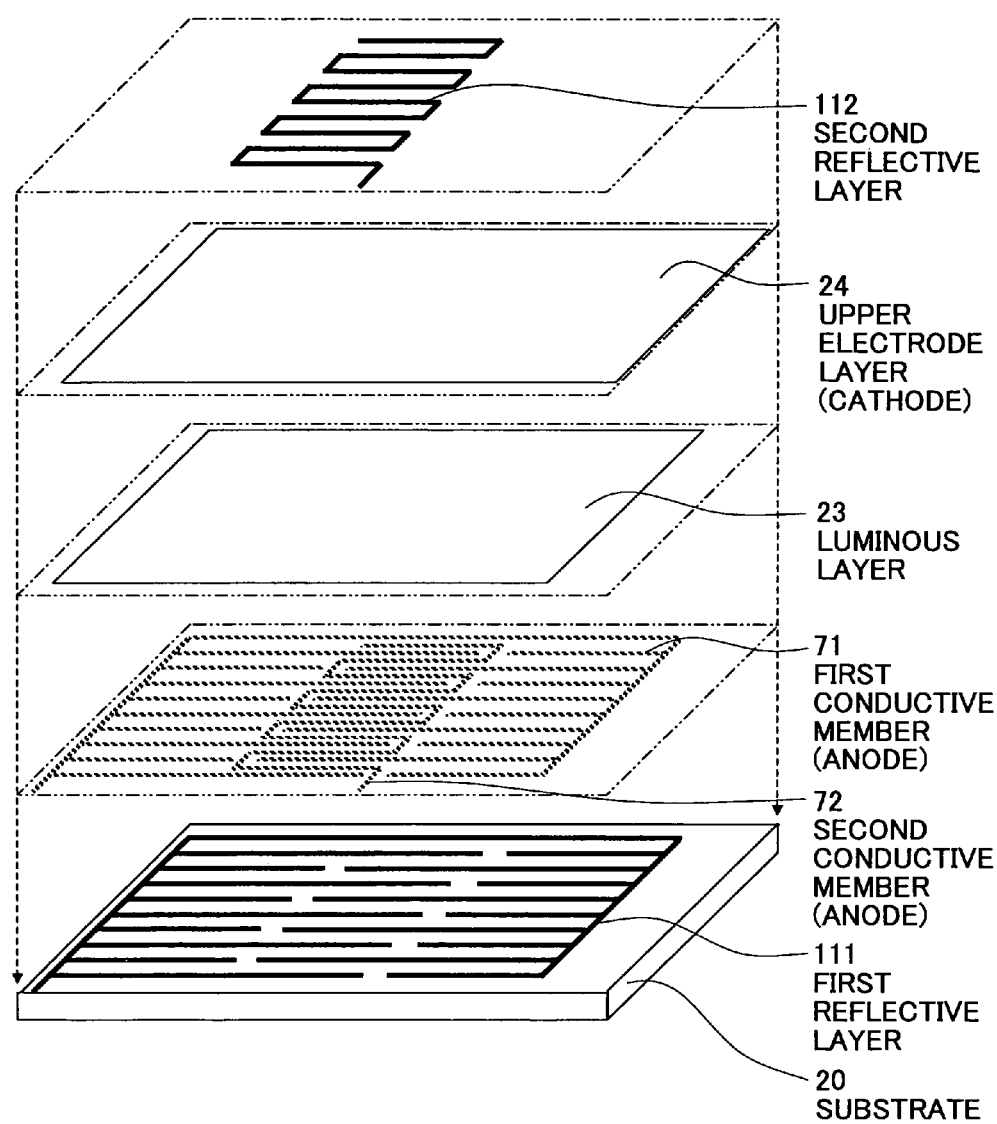
FIG. 11 is an exploded perspective view of the display according to Embodiment 3 of the present invention.

FIG. 11 is an exploded perspective view of the display according to Embodiment 3 of the present invention. The same numbers are given to the same elements as in Embodiment 2, and description thereof is not repeated. In Embodiment 3, a first reflective layer 111 for full luminescence is formed on the substrate 20, and a second reflective layer 112 for partial luminescence is formed on the upper electrode layer 24. These reflective layers 111 and 112 can be made of metal such as aluminum and silver by an appropriate method such as a sputtering method. The first and the second reflective layers 111 and 112 are patterned by a suitable method such as photolithography and etching. The first reflective layer 111 is formed according to the layout pattern of the first conductive member 71. The second reflective layer 112 is formed according to the layout pattern of the second conductive member 72.

FIG. 12 is a cross-sectional diagram of the display according to Embodiment 3. The first reflective layer 111 is formed corresponding to the side portions of the luminous layer 23, and the second reflective layer 112 is formed corresponding to the central part of the luminous layer 23.

Figure 13A:
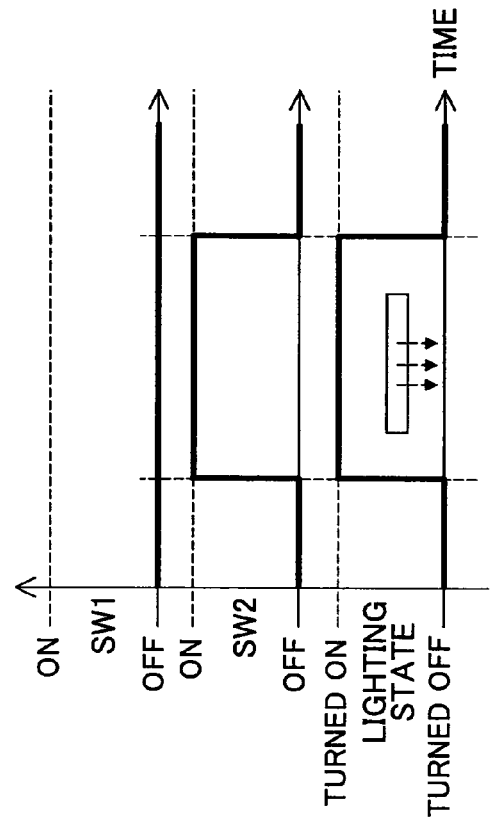
FIGS. 13A and FIG. 13B are graphs for explaining a light-emitting operation of the display.
Figure 13B:
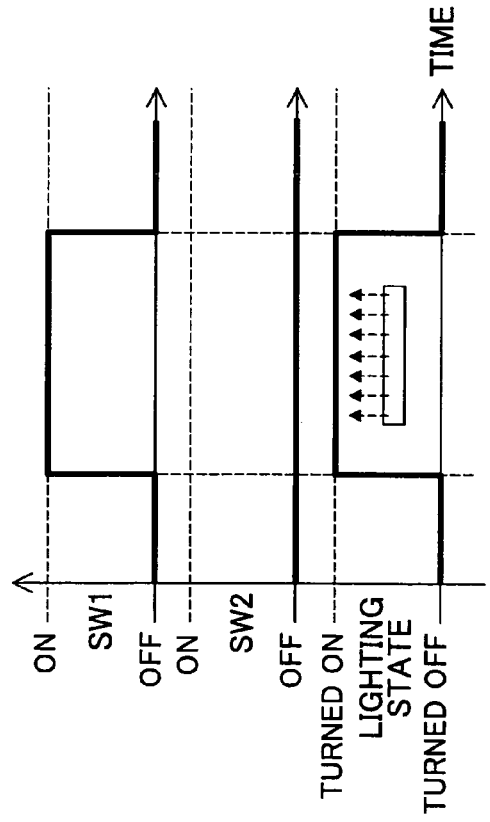

FIG. 13A and FIG. 13B are graphs for explaining the light-emitting operation of the display. The equivalent circuit of Embodiment 3 is the same as shown in FIG. 6. Since the opening and closing operations of the first and second switches SW1 and SW2, respectively, are the same as Embodiment 2, description is not duplicated. In Embodiment 3, the display includes the first and the second reflective layers 111 and 112, respectively. In the full operating mode, the light leaked to the substrate 20 side in Embodiments 1 and 2 is reflected by the first reflective layer 111 (FIG. 12), and all the light emitted by the luminous layer 23 can contribute to displaying. Further, in the partial operating mode, the light leaked to the upper electrode layer 24 side in Embodiments 1 and 2 is reflected by the second reflective layer 112, and all the light emitted by the luminous layer 23 can contribute to displaying. In this manner, according to Embodiment 3, the illumination efficiency and the use efficiency of power of the luminous layer 23 can be further raised in addition to the effects described concerning Embodiments 1 and 2.

Figure 14:
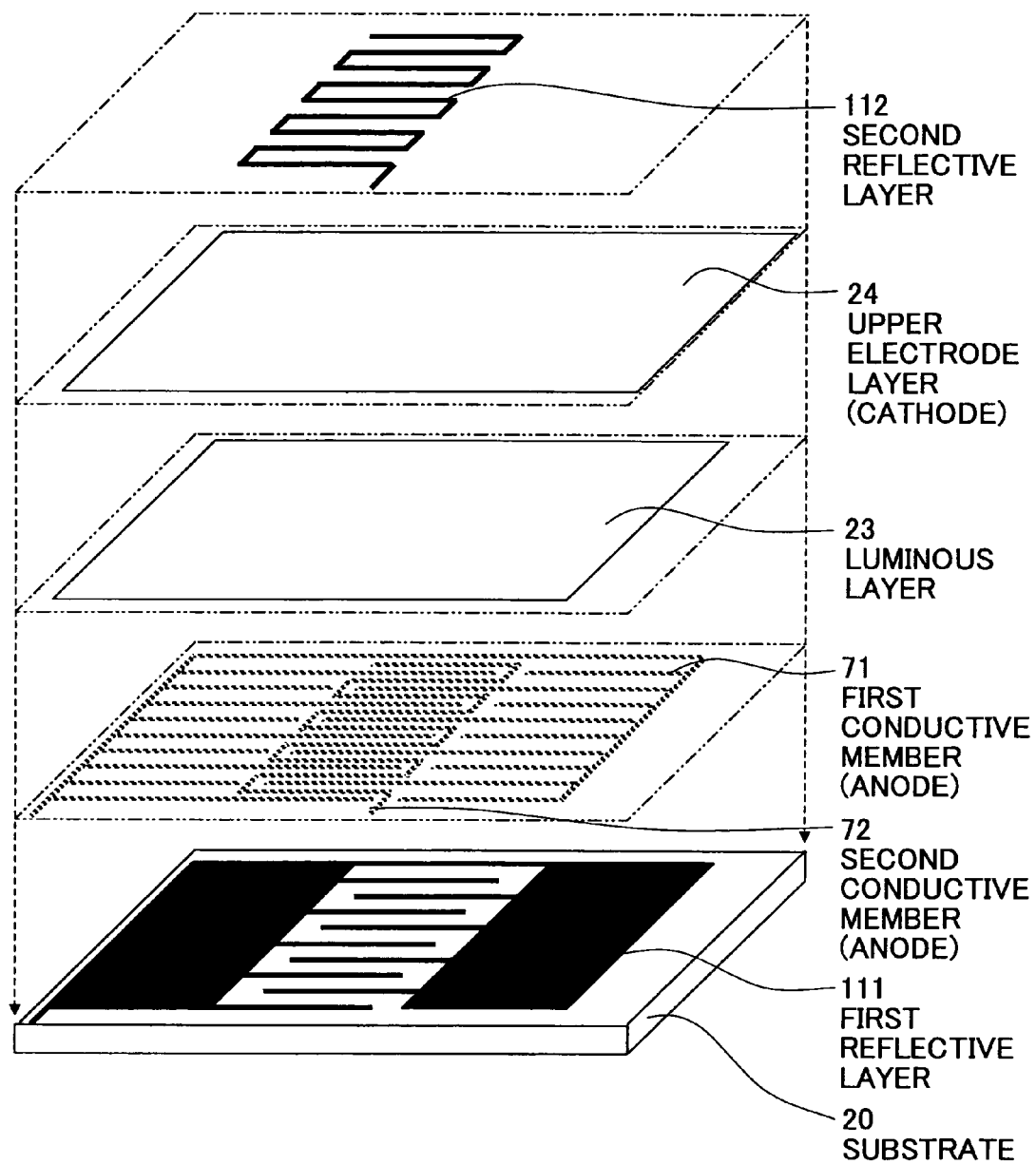
FIG. 14 is an exploded perspective view showing a modification of the layout pattern of a reflective layer.

According to Embodiment 3, the first reflective layer 111 has the same layout pattern as the first conductive member 71. However, as shown in FIG. 14, the side portions of the first reflective layer 111 do not have to be shaped like stripes or comb-teeth, but rather the entire side portions may be covered. Nevertheless, in the central part, the layout pattern has to be such that the first and the second reflective layers 111 and 112, respectively, do not overlap.

Further, although the first reflective layer 111 and the first conductive member 71 are separately constituted according to Embodiment 3, the first conductive member 71 can be formed with a conductive material that has an optical reflection property (for example, molybdenum, chromium, gold, silver and aluminum) serving both conductive and reflective functions, and the second conductive member 72 can be formed with a conductive material that has a light-transmitting property (for example, ITO), whereby the same action and effect as Embodiment 3 can be obtained.

Figure 15:
FIG. 15 gives tables for comparing power consumption between the displays according to Embodiments of the present invention and conventional examples.

FIG. 15 gives tables wherein the displays according to each Embodiment of the present invention are compared with displays according to conventional methods from a viewpoint of power consumption. As the displays (luminous layers) of the conventional methods, displays that use light emitting diodes (LED), a cold-cathode fluorescent lamp (CCFL), and inorganic EL are examined. As the displays of Embodiments 1, 2, and 3 of the present invention, luminous layers that consist of organic EL are used. Each display constitutes a double-sided luminescence type, the main display being 2-inch size (40.6 mm×30.5 mm), the sub-display being 1-inch size (20.3 mm×15.2 mm). Power required of each display for obtaining the brightness of 3000 cds (cd/m$^2$) is measured. "Common back light" in the table represents the cases where one luminous layer serves both front and rear displays. "Exclusive back light" represents the cases wherein each of the front and rear displays is served by an independent (exclusive use) luminous layer. As shown by two columns about the exclusive back light, it turns out that the main display consumes greater power than the sub-display. As shown by two columns about the common back light, it turns out that the same power amount is consumed by each of the main display and the sub-display.

On the other hand, the main display and the sub-display consume 0.74 W and 0.19 W, respectively, according to Embodiment 1; 0.74 W and 0.19 W, respectively, according to Embodiment 2; and 0.37 W and 0.09 W, respectively, according to Embodiment 3. Generally, organic EL consumes greater power than others, while providing good color quality. Nevertheless, according to the present invention, even if organic EL is used for the luminous layer, the power consumption is comparable with the display using LED, CCFL, and inorganic EL. Especially the power consumption of the display of Embodiment 3 using the reflective layer is one-half of the displays according to Embodiments 1 and 2, and favorably compares with the displays using CCFL of the exclusive back light method.

FIG. 16 gives tables wherein the displays according to Embodiments 1, 2 and 3 are compared with the displays of the conventional methods from a viewpoint of thickness. The thickness measured here is the sum of the thickness of the luminous layer, the electrode layer, and the substrate. Generally, since the exclusive back light method provides two displays separately on the front and the rear sides, the thickness tends to become twice the thickness of the common back light method. The thickness of Embodiments is comparable with the case where inorganic EL is used by the common back light method.

FIG. 17 give a table wherein power consumption ratios and thickness ratios of the display according to Embodiment 3 with reference to the conventional displays using the common back light method are provided. That is, the main display and the sub-display of the display of Embodiment 3 consume 70% and 17%, respectively, of the conventional display using LED, and the thickness of the former is 77% or less of the latter. Comparing with the conventional display using CCFL, the power consumption of the main display and the sub-display of the display of Embodiment 3 is 95% and 24%, respectively, and the thickness is 50% or less. Comparing with the conventional display using inorganic EL, the power consumption of the main display and the sub-display of the display of Embodiment 3 is 45% and 11%, respectively, and the thickness is approximately the same. In summary, according to Embodiment 3, especially the power consumption of the sub-display is remarkably reduced to a range between 11% and 24% of the conventional methods.

Although preferred embodiments of the present invention are explained as above, the present invention is not limited to these embodiments. For example, although the lower electrode layer is divided into two or more areas according to the Embodiments, the upper electrode layer may be divided into two or more areas, instead of or in addition to the lower electrode layer being divided. What is necessary is to apply a predetermined voltage only to a portion of the luminous layer 23 (portion corresponding to the sub-display area) in the partial operating mode. Further, Embodiments are described about the cases where only two displaying areas are present; however, the present invention can be applied to the case where more than two display areas are served, and the upper and/or the lower electrode layers are divided into two or more sections. What is necessary is the ability to adjust the range of a light emitting area of the luminous layer according to the area that displays information. For convenience of explanation, Embodiments are described as the display area being rectangular; nevertheless, the display area is not be limited to the rectangular shape, but may be other suitable forms. For example, the first and the second conductive members may be prepared alternately in the shape of concentric circles. What is important is that the electrode layer should be patterned according to the form of the displaying area. Although the present invention is conveniently applied to a small mobile terminal like a portable telephone, applications of the present invention are not limited to such a use, but the present invention can be applied to any display wherein reduction of the thickness and power consumption of the apparatus is desired.

Further, the present invention is not limited to these embodiments, but variations and modifications may be made without departing from the scope of the present invention.

The present application is based on Japanese Priority Application No. 2005-073981 filed on Mar. 15, 2005 with the Japanese Patent Office, the entire contents of which are hereby incorporated by reference.

What is claimed is:

1. A lighting apparatus for irradiating a first display and a second display having a first formation range and a second formation range, respectively, wherein the first formation range is larger than the second formation range, comprising:
   a first light-transmitting electrode layer, a second light-transmitting electrode layer, and a luminous layer provided between the first and the second light-transmitting electrode layers, all substantially the size of the first formation range;
   the luminous layer having a single electroluminescent material and extending over the first formation range;
   at least a first conductive member and a second conductive member; and
   a switching unit that provides a potential between the first and second conductive member and the second light-transmitting electrode layer so as to irradiate the first display and provides a potential between the second conductive member and the second light-transmitting electrode layer so as to irradiate the second display.

2. The lighting apparatus as claimed in claim 1, further comprising:
   a liquid crystal board for receiving light from the luminous layer.

3. The lighting apparatus as claimed in claim 1, wherein the lighting apparatus is of a double-sided luminescence type.

4. The lighting apparatus as claimed in claim 3, wherein light is irradiated to the first display by applying a predetermined voltage to the first conductive member, and light is irradiated to the second display of another side by applying a predetermined voltage to the second conductive member.

5. The lighting apparatus as claimed in claim 1, wherein a predetermined voltage is selectively applied to one of the first conductive member and the second conductive member, and another predetermined voltage is always applied to the other.

6. The lighting apparatus as claimed in claim 1, wherein a predetermined voltage is applied to one of the first conductive member and the second conductive member.

7. The lighting apparatus as claimed in claim 1, wherein the luminous layer is an electroluminescent layer.

8. The lighting apparatus as claimed in claim 1, wherein the luminous layer is an organic electroluminescent layer.

9. The lighting apparatus as claimed in claim 1, wherein the layout pattern of the first and the second conductive members is in a comb-teeth shape.

10. The lighting apparatus as claimed in claim 1, wherein each of the first and the second conductive members has a layout pattern that includes a plurality of stripe-like linear elements, and the linear elements of the first and the second conductive members are alternately arranged in a certain area.

11. A lighting apparatus for irradiating a first display and a second display having a first formation range and a second formation range, respectively, wherein the first formation range is larger than the second formation range:
   a first light-transmitting electrode layer, a second light-transmitting electrode layer, and a luminous layer provided between the first and the second light-transmitting electrode layers, all of substantially the size of the first formation range;
   the luminous layer having a single electroluminescent material and extending over the first formation range;
   at least a first conductive member and a second conductive member in combination extending over the entire range of the first light-transmitting electrode layer; and
   a switching unit that provides a potential between the first and second conductive member and the second light-transmitting electrode layer so as to irradiate the first display and provides a potential between the second conductive member and the second light-transmitting electrode layer so as to irradiate the second display,
   a light reflective layer prepared at a position that counters at least one of the first conductive member and the second conductive member.

12. The lighting apparatus as claimed in claim 11, wherein the light reflective layer has a layout pattern that is the same as the layout pattern of at least one of the first conductive member and the second conductive member.

13. The lighting apparatus as claimed in claim 11, wherein the light reflective layer consists of metal.

14. The lighting apparatus as claimed in claim 11, wherein at least one of the first conductive member and the second conductive member consists of an electric conductive material that has an optical reflection property.

15. A display apparatus, comprising:
   a lighting apparatus for irradiating a first display and a second display having a first formation range and a second formation range, respectively, wherein the first formation range is larger than the second formation range:
   a first light-transmitting electrode layer, a second light-transmitting electrode layer, and a luminous layer provided between the first and the second light-transmitting electrode layers, all of substantially the size of the first formation range;
   the luminous layer having a single electroluminescent material and extending over the first formation range;
   at least a first conductive member and a second conductive member in combination extending over the entire range of the first light-transmitting electrode layer; and
   a switching unit that provides a potential between the first and second conductive member and the second light-transmitting electrode layer so as to irradiate the first display and provides a potential between the second conductive member and the second light-transmitting electrode layer so as to irradiate the second display;
   a substrate for supporting the lighting apparatus;
   a main display provided at one side of the lighting apparatus; and
   a sub-display provided at the other side of the lighting apparatus.

* * * * *